(12) United States Patent
Verhaverbeke et al.

(10) Patent No.: US 7,521,374 B2
(45) Date of Patent: Apr. 21, 2009

(54) METHOD AND APPARATUS FOR CLEANING SEMICONDUCTOR SUBSTRATES

(75) Inventors: Steven Verhaverbeke, San Francisco, CA (US); Dennis Yost, Los Gatos, CA (US); Roman Gouk, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 855 days.

(21) Appl. No.: 10/997,194

(22) Filed: Nov. 23, 2004

(65) Prior Publication Data

US 2006/0107970 A1   May 25, 2006

(51) Int. Cl.
*H01L 21/461* (2006.01)
*H01L 21/31* (2006.01)

(52) U.S. Cl. .......................... 438/745; 438/747; 134/1; 134/1.3

(58) Field of Classification Search ............... 134/1–1.3
See application file for complete search history.

(56) References Cited

U.S. PATENT DOCUMENTS 6,548,228 B2   4/2003   Mutoh

| | | | |
|---|---|---|---|
| 2002/0029788 A1* | 3/2002 | Verhaverbeke et al. | 134/1.3 |
| 2002/0096196 A1 | 7/2002 | Toshima et al. | |
| 2004/0097389 A1* | 5/2004 | Yeo et al. | 510/175 |
| 2004/0163668 A1* | 8/2004 | Chung et al. | 134/1 |
| 2005/0178402 A1* | 8/2005 | Stowell et al. | 134/1.3 |
| 2006/0042651 A1* | 3/2006 | Verhaverbeke et al. | 134/1 |

* cited by examiner

*Primary Examiner*—Duy-Vu N Deo
(74) *Attorney, Agent, or Firm*—Blakely, Sokoloff, Taylor & Zafman LLP

(57) ABSTRACT

According to one aspect of the present invention, a method and apparatus for cleaning a semiconductor substrate is provided. The method may include supporting a semiconductor substrate, the semiconductor substrate having a surface, and dispensing an amount of semiconductor substrate processing liquid onto the surface of the semiconductor substrate, the amount of semiconductor substrate processing liquid being such that substantially none of the semiconductor substrate processing liquid flows off the surface of the semiconductor substrate. The semiconductor substrate processing fluid may form a standing puddle on the surface of the semiconductor substrate. The semiconductor substrate may be rotated while the semiconductor substrate processing liquid is on the surface of the semiconductor substrate such that substantially all of the amount of semiconductor substrate processing liquid remains on the surface of the semiconductor substrate during said rotation.

30 Claims, 8 Drawing Sheets

METHOD AND APPARATUS FOR CLEANING SEMICONDUCTOR SUBSTRATES

BACKGOUND OF THE INVENTION

1). Field of the Invention

This invention relates to a method and apparatus for cleaning semiconductor substrates.

2). Discussion of Related Art

Integrated circuits are formed on semiconductor wafers. The wafers are then sawed (or "singulated" or "diced") into microelectronic dice, also known as semiconductor chips, with each chip carrying a respective integrated circuit. Each semiconductor chip is then mounted to a package, or carrier, substrate. Often the packages are then mounted to a motherboard, which may then be installed into a computing system.

Numerous steps may be involved in the creation of the integrated circuits, such as the formation and etching of various semiconductor, insulator, and conductive layers. During the manufacturing of the integrated circuits, the surface of the wafer may also have to be cleaned at various times before the formation of the integrated circuits can be completed. One common method for cleaning the wafers is referred to as "spin cleaning."

Spin cleaning involves dispensing a cleaning solution onto the wafer and spinning the wafer to remove the solution. Typically, in order to effectively clean the wafer, the wafer must undergo several spin clean "passes." On each pass a relatively large amount of the solution, sometimes over 300 milliliters, is dispensed onto the wafer as it spins.

The solutions used to clean the wafers are sometimes very expensive, particularly those used to clean copper and low-k dielectric surfaces. Thus, manufacturers often recycle, or re-circulate, the cleaning solution from each pass so that it may be reused on a subsequent pass.

In order to prevent the expensive cleaning solutions from becoming contaminated, only one type of solution can be used during each pass. Recently, multi-level spin cleaning apparatuses have been designed that move the substrate between the different levels so that a single apparatus may clean the substrate with several different solutions and recycle them all without contamination. However, these recycling systems are complicated and expensive. Additionally, when the two sides of the wafer require different types of cleaning solutions, the wafer must still undergo an additional spin cleaning process.

Furthermore, even when only one cleaning solution is used at a time, and recycled, some contamination occurs as the solution picks up contaminates from the surface that is being cleaned, resulting in inconsistent chemistry as the substrates are exposed to a slightly different chemical solution on each pass.

SUMMARY OF THE INVENTION

The invention provides a method and apparatus for cleaning a semiconductor substrate. The method may include supporting a semiconductor substrate, the semiconductor substrate having a surface, and dispensing an amount of semiconductor substrate processing liquid onto the surface of the semiconductor substrate, the amount of semiconductor substrate processing liquid being such that substantially none of the semiconductor substrate processing liquid flows off the surface of the semiconductor substrate. The semiconductor substrate processing fluid may form a standing puddle on the surface of the semiconductor substrate. The semiconductor substrate may be rotated while the semiconductor substrate processing liquid is on the surface of the semiconductor substrate such that substantially all of the amount of semiconductor substrate processing liquid remains on the surface of the semiconductor substrate during said rotation.

BRIEF DESCRIPTION OF THE DRAWINGS

The invention is described by way of example with reference to the accompanying drawings wherein.

DETAILED DESCRIPTION OF THE INVENTION

In the following description, various aspects of the present invention will be described, and various details will be set forth in order to provide a thorough understanding of a present invention. However, it will be apparent to those skilled in the art that the present invention may be practiced with only some or all of the aspects of the present invention, and the present invention may be practiced without the specific details. In other instances, well-known features are omitted or simplified in order not to obscure the present invention.

It should be understood that FIGS. 1-4C are merely illustrative and may not be drawn to scale.

FIG. 1 to FIG. 4C illustrate a method and apparatus for cleaning a semiconductor substrate. The method may include supporting a semiconductor substrate, the semiconductor substrate having a surface, and dispensing an amount of semiconductor substrate processing liquid onto the surface of the semiconductor substrate, the amount of semiconductor substrate processing liquid being such that none of the semiconductor substrate processing liquid flows off the surface of the semiconductor substrate. The semiconductor substrate processing fluid may form a standing puddle on the surface of the semiconductor substrate. The semiconductor substrate may be rotated while the semiconductor substrate processing liquid is on the surface of the semiconductor substrate such that substantially all of the amount of semiconductor substrate processing liquid remaining on the surface of the semiconductor substrate during said rotation.

Figure 1:
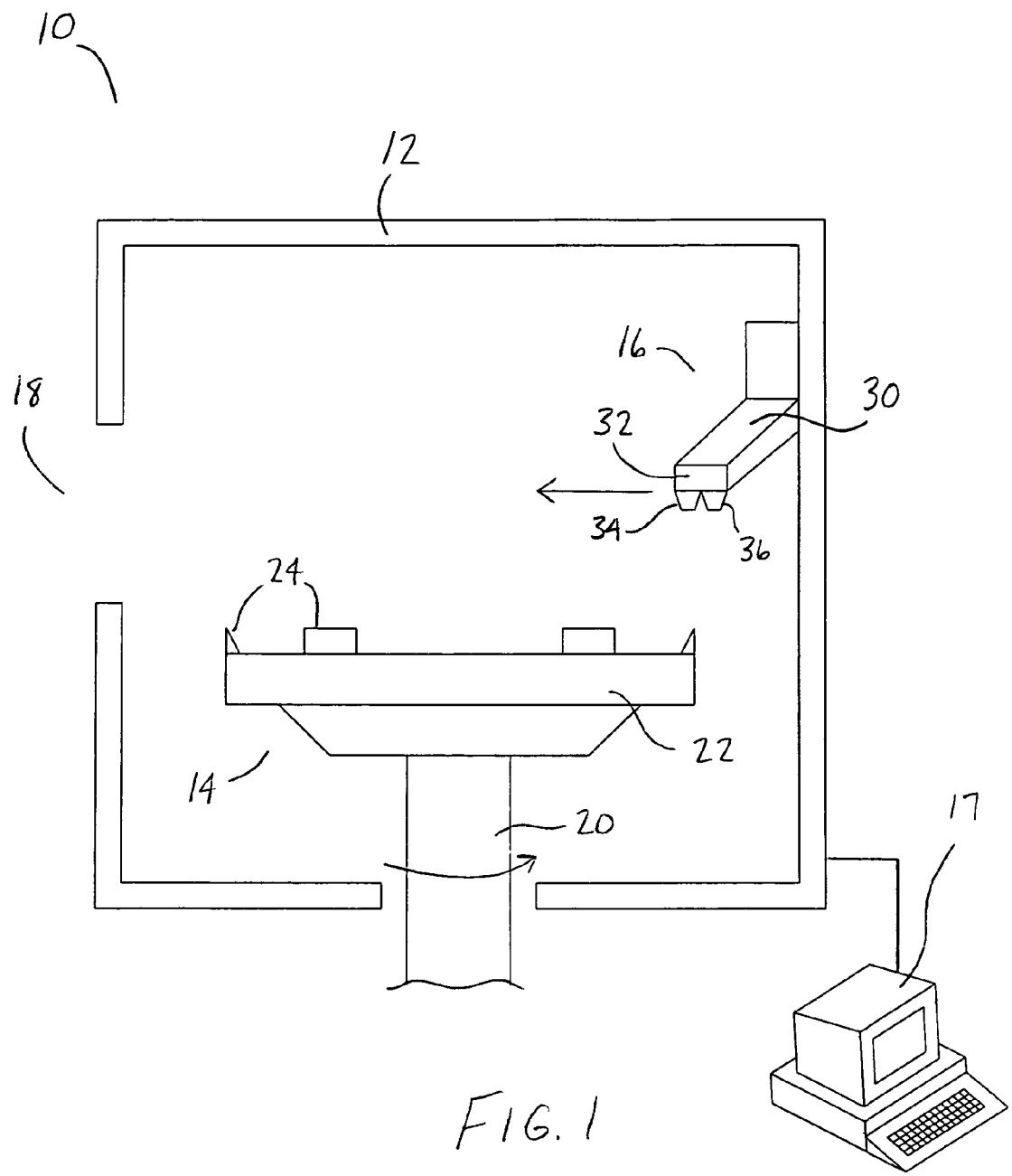
FIG. 1 is a cross-sectional schematic view of a semiconductor substrate processing apparatus, including a substrate support assembly and a dispense assembly.
Figure 2:
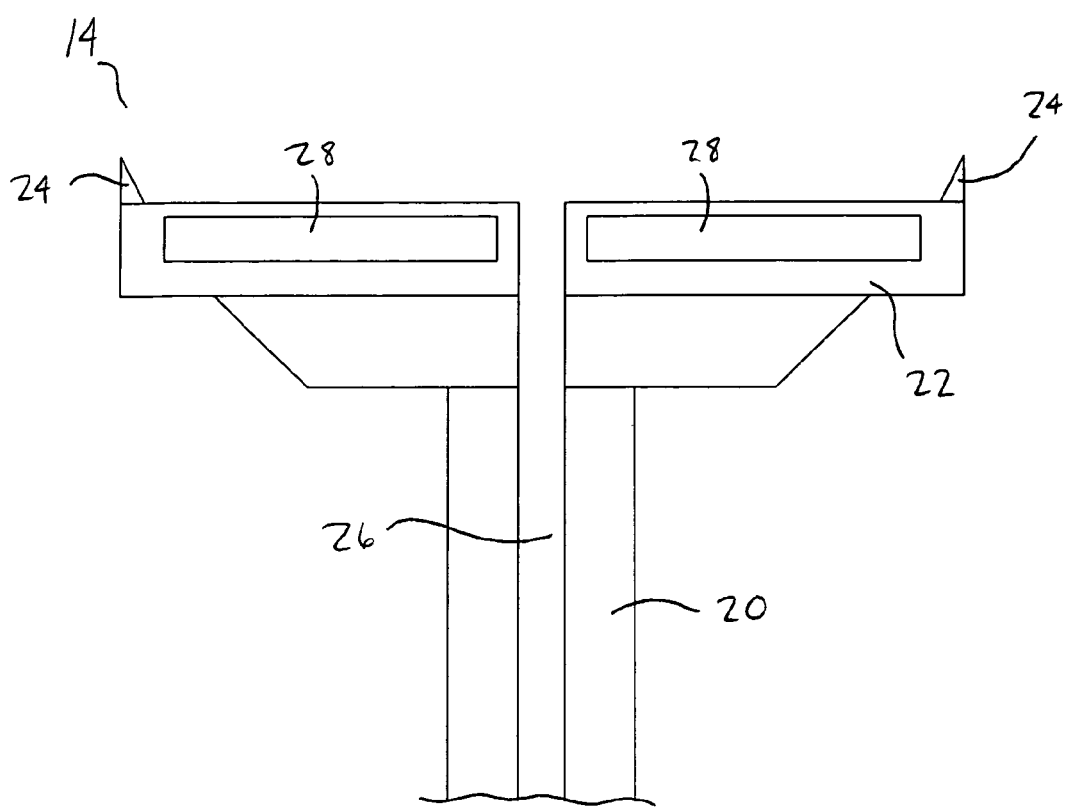
FIG. 2 is a cross sectional side view of the substrate support assembly.

FIGS. 1 and 2 illustrate a semiconductor substrate processing apparatus, or a spin clean chamber 10, according to one embodiment of the present invention. The spin clean chamber 10 may include a chamber wall 12, a substrate support assembly 14, a dispense assembly 16, and a computer control console 17. The chamber wall 12 may be, in cross-section, substantially square with a substrate slit 18, in one side thereof.

The substrate support assembly 14 may lie within the chamber wall 12 at a lower portion thereof at a height lower than the substrate slit 18. The substrate support assembly 14 may include a substrate support axis 20 and a substrate support 22. The substrate support axis 20 may vertically extend through a lower piece of the chamber wall 12, and the substrate support 22 may be attached to an upper end of the substrate support axis 20. The substrate support axis 20 may be able to rotate the substrate support 22 about a central axis thereof at various rates between, for example, 1 revolution per minute (rpm) and 3000 rpm.

As illustrated in FIGS. 1 and 2, the substrate support 22 may include support members 24 which extend upwards from an outer edge of the substrate support 22 and transducers 28 which may be embedded in the substrate support 22. A support liquid channel 26 may run vertically through a central portion of the substrate support 22 and the substrate support axis 20.

Although not illustrated in detail, it should be understood that the support liquid channel 26 may be connected to supplies of various semiconductor substrate processing liquids.

Referring again to FIG. 1, the dispense assembly 16 may be attached to an upper portion of a sidepiece of the chamber wall 12 opposite the substrate slit 18. The dispense assembly 16 may include a dispense arm 30 and a dispense head 32. The dispense arm 30 may be rotatably connected to the chamber wall 12 to move the dispense head 32 back and forth between a position where the dispense head 32 is not positioned over the substrate support 22 and a position where the dispense head 32 is suspended over the substrate support 22. The dispense head 32 may be attached to an end of the dispense arm 30 and may include a first nozzle 34 and a second nozzle 36. Although, not illustrated in detail, it should be understood that both the first 34 and second 36 nozzles may be also be connected to supplies of various semiconductor substrate processing liquids through fluid channels that run through the dispense arm 30.

The computer control console 17 may be in the form of a computer having memory for storing a set of instructions and a processor connected to the memory for executing the instructions, as is commonly understood in the art. The instructions stored within the memory may include a method including spraying a relatively low amount of solution onto a substrate on the substrate support 22, rotating the substrate support 22 at a relatively low rate, allow the solution to stand on the substrate before being rinsed off the substrate, as described below. The computer control console 17 may be electrically connected to both the substrate support assembly 14 and the dispense assembly 16, as well as all of the various components thereof, and may be used to control and coordinate the various operations of the spin clean chamber 10.

Figure 3A:
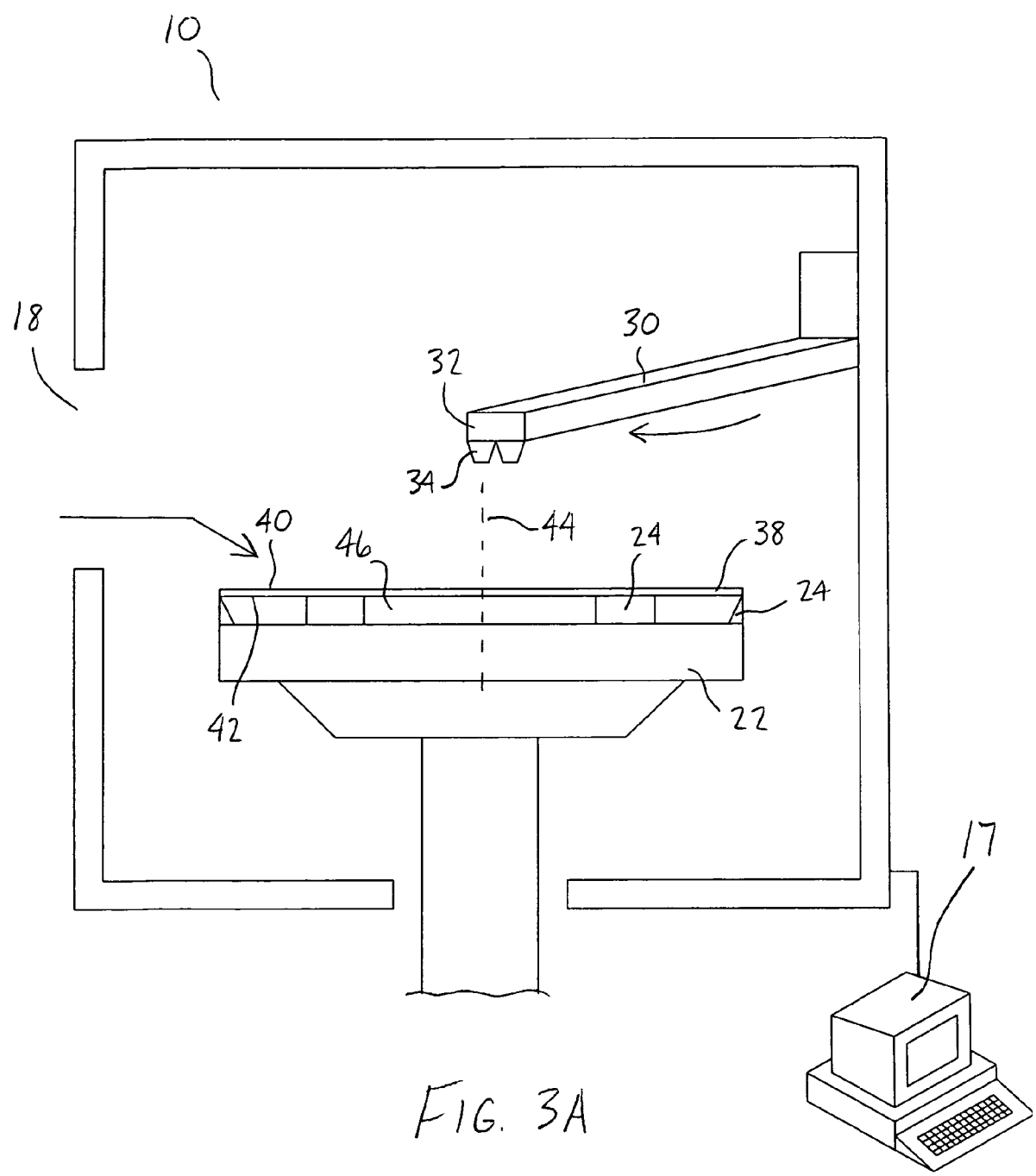
FIG. 3A is a cross-sectional schematic view of the semiconductor substrate processing apparatus similar to FIG. 1.

In use, referring to FIG. 3A, a semiconductor substrate 38, such as a semiconductor wafer with a diameter of, for example, 200 or 300 millimeters, may be transported through the substrate slit 18, over the substrate support 22, and directly onto the support members 24. The semiconductor substrate 38 may have an upper surface 40 (or a "device" surface), a lower surface 42 (or a "back-side" or "non-device" surface), and a central axis 44. The upper surface 40 of the semiconductor substrate 38 may have, for example, portions of exposed copper or low-k dielectric, such as carbon-doped oxide, a hydrogen or oxygen-doped silicon oxide, or an organic based low-k dielectric. The lower surface 42 of the semiconductor substrate 38 may have, for example, portions of exposed silicon.

Figure 3B:
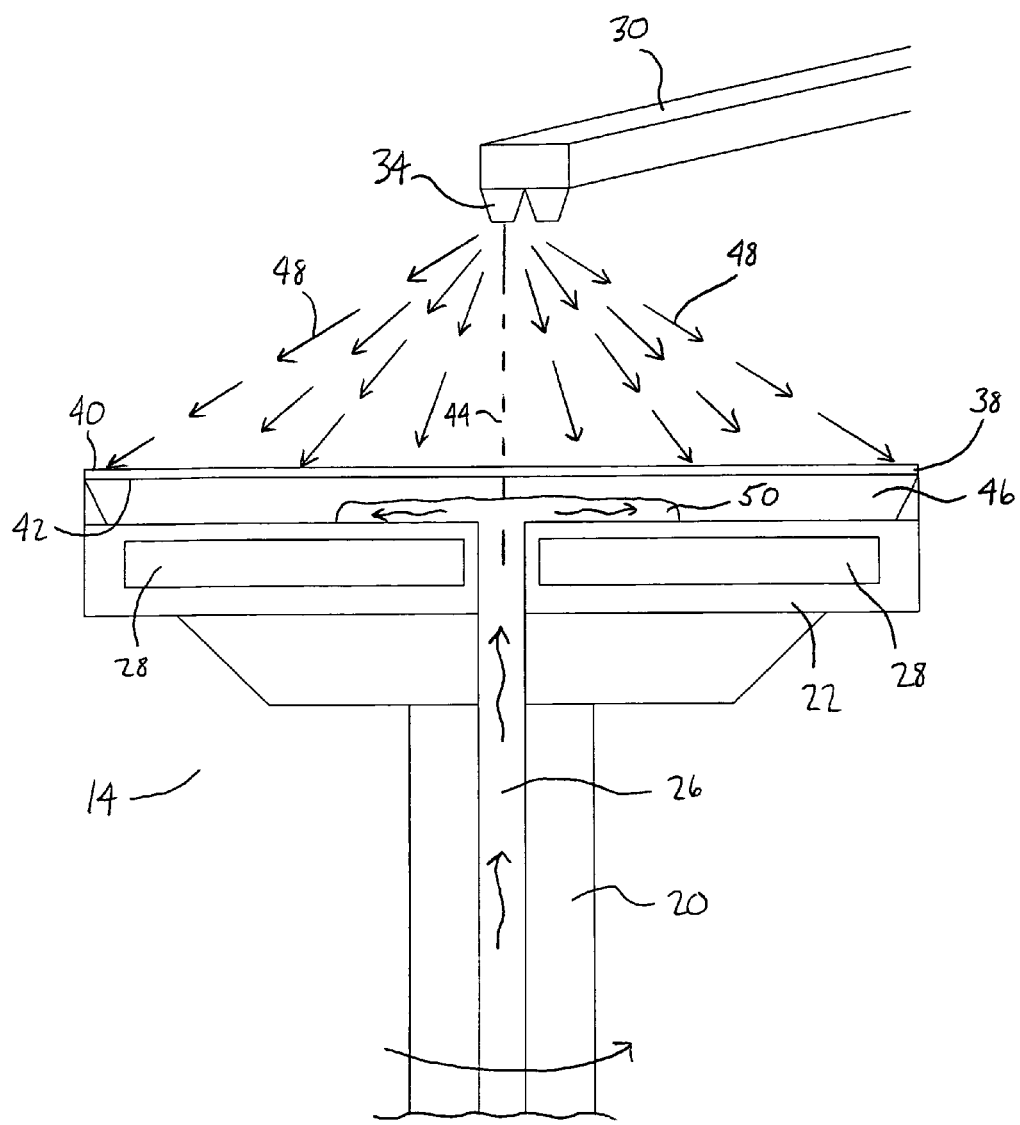
FIGS. 3B and 3C are cross-sectional side views of the substrate support assembly and the dispense assembly illustrating operation of the semiconductor substrate processing apparatus.

Although not illustrated in detail, the semiconductor substrate 38 may be "wedged" between the support members 24 so that the central axis 44 is positioned over a central portion of the substrate support 22, and the support members 24 may prevent the semiconductor substrate 38 from moving laterally between edges of the substrate support 22. As illustrated in FIG. 3B, a gap 46 may lie between the lower surface 42 of the semiconductor substrate 38 and the transducers 28 within the substrate support 22.

Referring again to FIG. 3A, after the semiconductor substrate 38 has been placed on the substrate support 22, the dispense arm 30 may rotate such that the dispense head 32 is suspended over the semiconductor substrate 38 in a first position. In particular, the dispense head 32 may be suspended above the semiconductor substrate 38 such that the first nozzle 34 is positioned directly over the primary axis 44 of the semiconductor substrate 38.

As illustrated in FIG. 3B, the substrate support axis 20 may then rotate the substrate support 22 about the central axis 44. The substrate support 22, and thus the semiconductor substrate 38, may be rotated at a first, relatively low rate, such as less than 100 rpm or less than 50 rpm. In one embodiment, the first rate may be less than 30 rpm, such as 15 rpm.

After the rotation of the substrate support 22 has begun at a low rate, a first semiconductor substrate processing liquid 48 may be sprayed from the first nozzle 34 onto the upper surface 40 of the semiconductor substrate 38. The first semiconductor substrate processing liquid 48 may be suitable to clean the portions of the upper surface 40 of the semiconductor substrate 38 with the exposed copper or low-k dielectric, such as ST-250 manufactured by ATMI, ACT NE-14 manufactured by Air Products, or LK-1 manufactured by Kanto, or other suitable cleaning solutions.

As the first semiconductor substrate processing liquid 48 leaves the first nozzle 34, the liquid 48 may be in the form of micro-particles which are sprayed substantially over the entire upper surface 40 of the semiconductor substrate 38 in a substantially even fashion. The rotation of the semiconductor substrate 38 about the central axis 44 may further increase the evenness of the distribution of the first semiconductor substrate processing liquid 48. The first semiconductor processing liquid 48 may be sprayed for a relatively short amount of time, such as between approximately 3 and 5 seconds. The amount of the first semiconductor substrate processing liquid 48 that is sprayed onto the upper surface 40 of the semiconductor substrate 38 may be relatively small, such as less than 100 milliliters (ml), in particular less than 30 ml. In one embodiment, when the semiconductor substrate 38 is a wafer having a diameter of approximately 300 mm, and the amount of the first semiconductor processing liquid 48 dispensed on the upper surface 40 may be approximately 15 ml.

Still referring to FIG. 3B, before, during, or after the spraying of the first semiconductor substrate processing liquid 48, a second semiconductor substrate processing liquid 50 may be injected into the gap 46 beneath the substrate 38 through the support liquid channel 26. The second semiconductor substrate processing liquid 50 may be a mixture of ammonium hydroxide ($NH_4OH$) and hydrogen peroxide ($H_2O_2$), or other suitable cleaning solution.

Figure 3C:
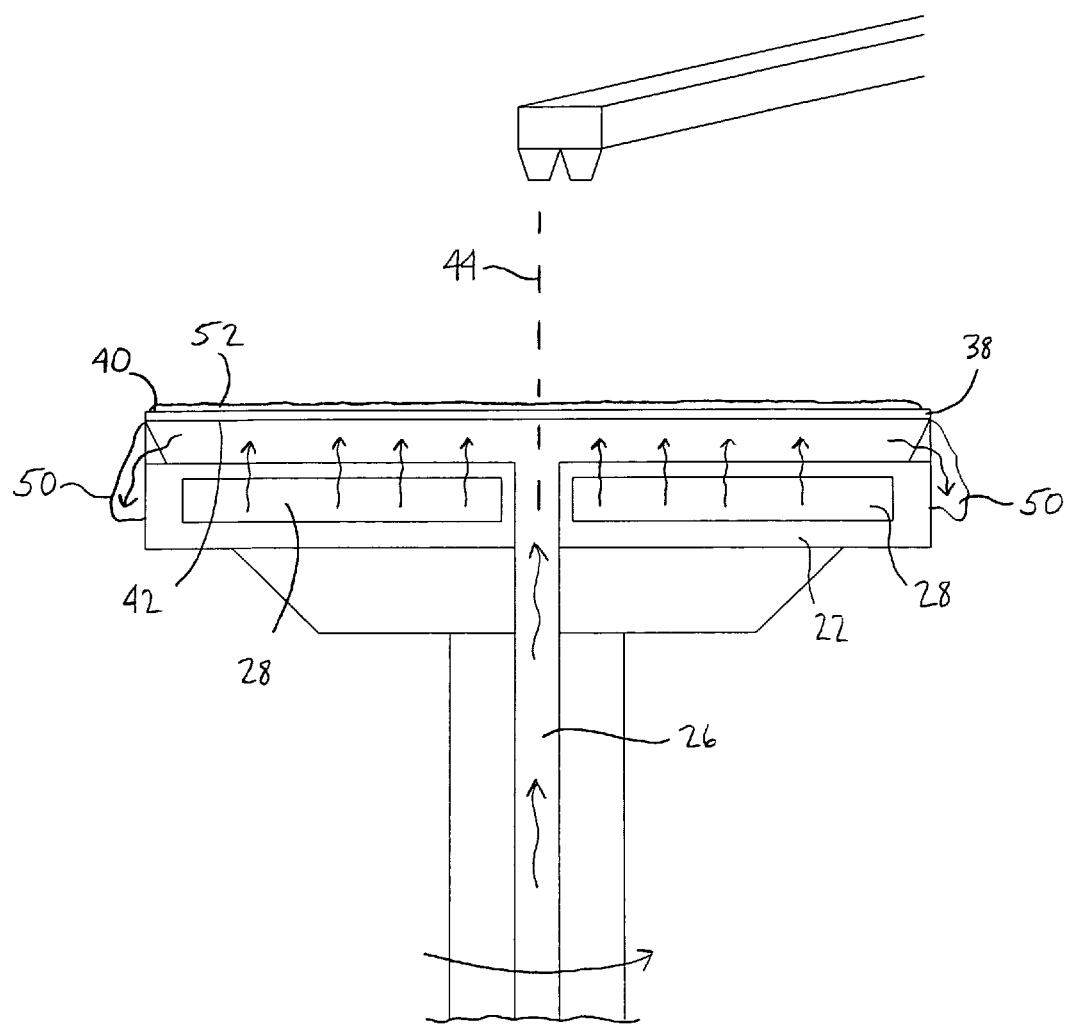

As illustrated in FIG. 3C, after the first semiconductor substrate processing liquid 48 has been dispensed onto the semiconductor wafer 38, a puddle 52 of the first semiconductor substrate processing liquid 48 may stand on the upper surface 40 of the semiconductor substrate 38. The puddle 52 may have, for example, a thickness of between approximately 100 and 200 microns. As illustrated in FIG. 3C, the puddle 52 may cover substantially all of the upper surface 40 of the semiconductor substrate 38. Because of the relatively small amount of liquid 48 dispensed onto the upper surface 40 of the semiconductor substrate 38, as well as the relatively low rate of rotation of the semiconductor substrate 38, along with the surface tension of the liquid within the puddle 52, all, or substantially all, of the liquid 48 within the puddle 52 remains on and cleans the upper surface 40 of the semiconductor substrate 38. In other words, substantially none of the liquid within the puddle 52 flows off the substrate 38.

Still referring to FIG. 3C, as the second semiconductor substrate processing liquid 50 fills the gap 46, the transducers 28 may be activated to send mega sonic energy through the second semiconductor substrate processing liquid 50 to clean the lower surface 42 of the semiconductor substrate 38. The mega sonic energy may also travel through the substrate 38 and assist in the cleaning of the upper surface 40. As illustrated, as the second semiconductor substrate processing liquid 50 reaches the outer portions of the substrate support 22, the second semiconductor substrate processing liquid 50 may flow off the edges of the substrate support 22 and may be disposed of as is commonly understood in the art.

Still referring to FIG. 3C, the puddle 52 may be allowed to stand on the upper surface 40 of the semiconductor substrate 38 for an extended period of time. In one embodiment, the puddle 52 may be allowed to stand on, and clean, the upper surface 40 of the semiconductor substrate for over 10 seconds, or even 30 seconds. The substrate support axis 20 may continue to rotate the substrate support 22 at the first rate for the entire time that the puddle 52 remains standing on the upper surface 40 of the semiconductor substrate 38.

Figure 4A:
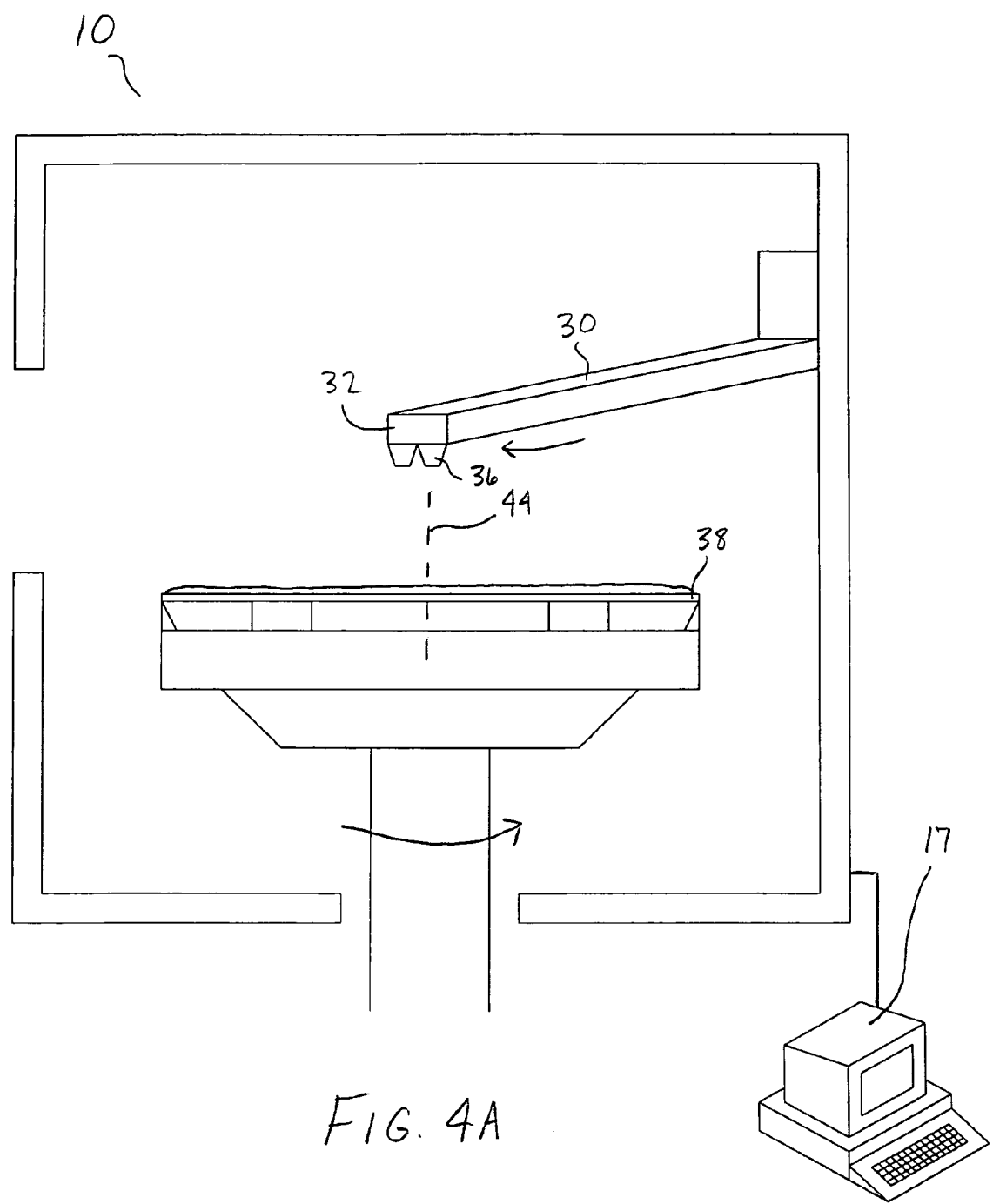
FIG. 4A is a cross-sectional schematic view of the semiconductor substrate processing apparatus similar to FIG. 3A.
Figure 4B:
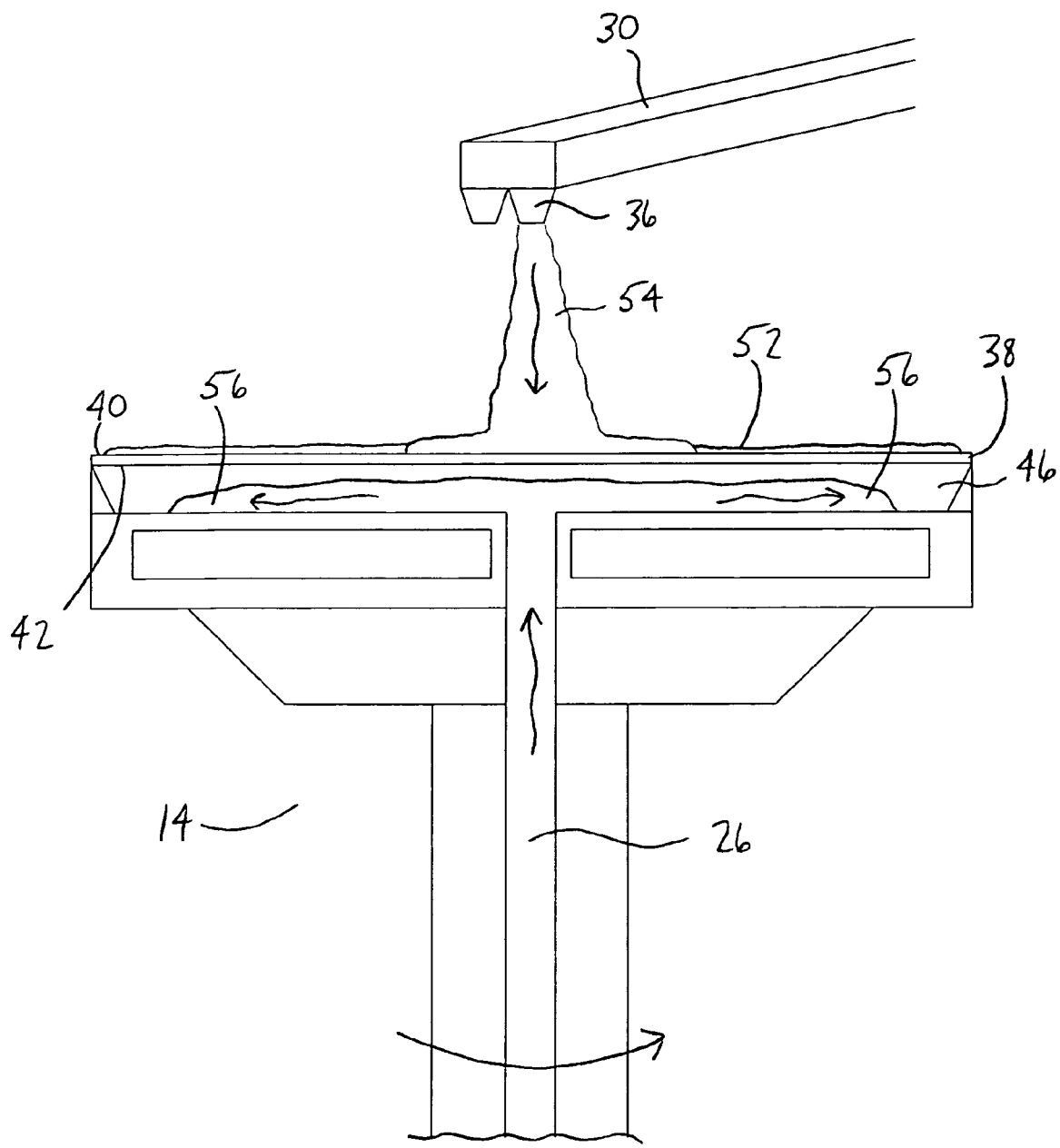
FIGS. 4B and 4C are cross-sectional side views of the substrate support assembly and dispense assembly illustrating operation of the semiconductor substrate processing apparatus.

As illustrated in FIG. 4A, the dispense arm 30 may then rotate such that the dispense head 32 is suspended in a second position over the semiconductor substrate 38. In particular, the dispense head 32 may now be suspended such that the second nozzle 36 is positioned directly above the central axis 44 of the semiconductor substrate 38. As illustrated in FIG. 4B, a third semiconductor substrate processing liquid 54 may then be dispensed from the second nozzle 36 onto the upper surface 40 of the semiconductor substrate 38. A fourth semiconductor substrate processing liquid 56 may also be directed into the gap 46 through the support liquid channel 26 at approximately the same time. The third 54 and fourth 56 semiconductor substrate processing liquids may be, for example, de-ionized water to rinse the upper 40 and lower 42 surfaces of the semiconductor substrate 38.

Figure 4C:
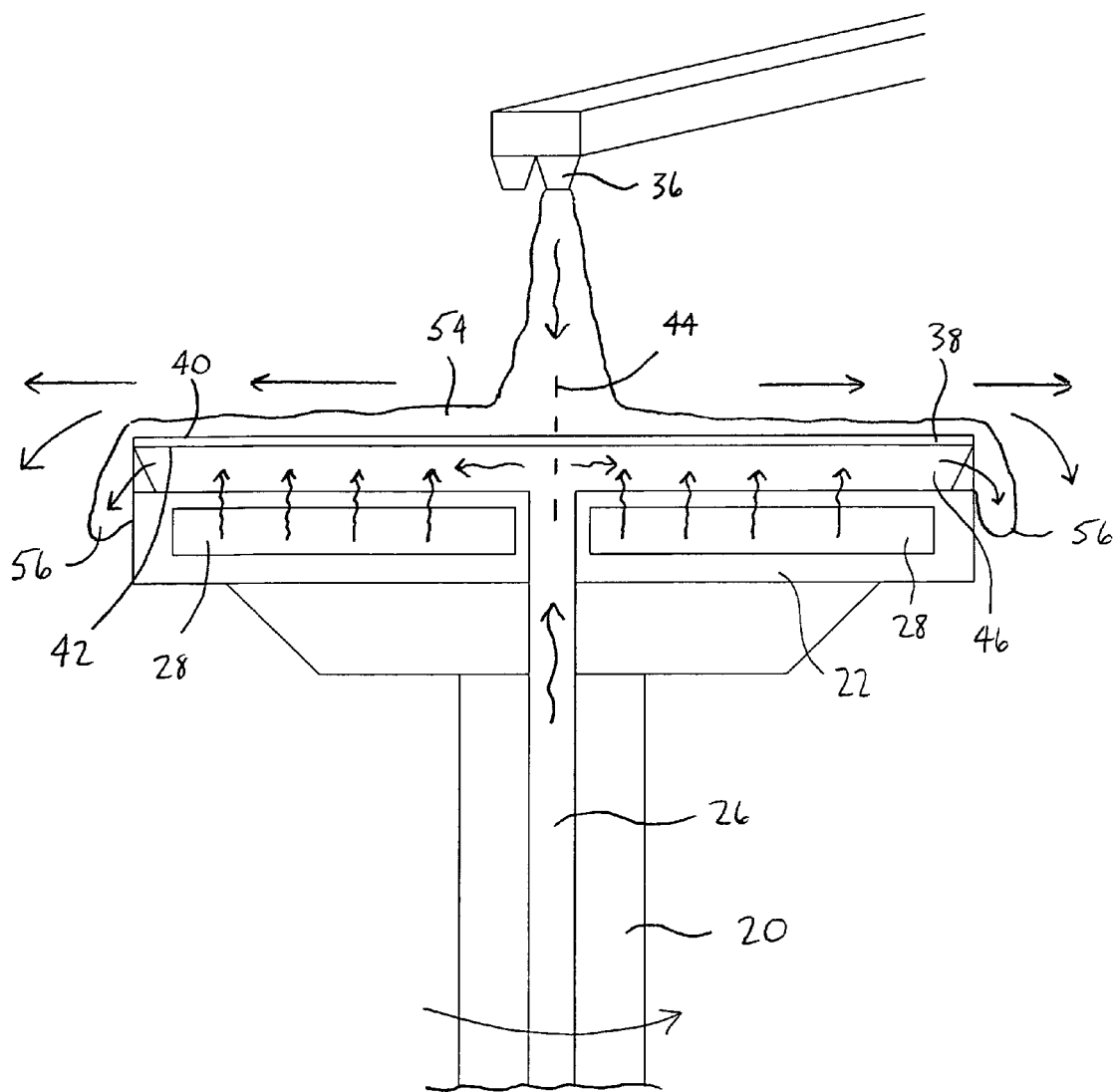

As illustrated in FIG. 4C, the amount of the third semiconductor substrate processing liquid 54 that is dispensed onto the upper surface 40 of the semiconductor substrate 38 may be sufficiently high such that the third semiconductor substrate processing liquid 54 flows off the upper surface 40. As the fourth semiconductor substrate processing liquid 56 fills the gap 46 the transducers 28 may be activated and may transfer mega sonic energy through the fourth semiconductor substrate processing liquid 56 onto the bottom surface 42 of the semiconductor substrate 38. The mega sonic energy may also travel through the substrate 38 and assist in the cleaning, or rinsing, of the upper surface 40. Before, during, or after the dispensation of the third 54 and fourth 56 semiconductor substrate processing liquids, the substrate support axis 20 may rotate the substrate support 22 at a relatively high, second rate causing the semiconductor substrate 38 to be rotated about the central axis 44 at a higher speed. The second rate may be between 100 and 1000 rpm, or higher. In an embodiment, the second rate is approximately 300 rpm.

Still referring to FIG. 4C, as the substrate support 22 is rotated at the second rate, due to the centrifugal force caused by the relatively high rate of rotation, the third 54 and fourth 57 semiconductor substrate processing liquids are "spun off" the semiconductor substrate 38 and the substrate support 22. Both the third 54 and fourth 56 semiconductor substrate processing liquids may be continued to be dispensed as the substrate support 22 is rotated at the second rate. After the dispensation of the third 54 and fourth 56 semiconductor substrate processing liquids, the rotation of the substrate support 22 at the second rate may continue for an extended period of time, such as 20 seconds, to continue removing the liquids from the substrate 38 and the substrate support 22, and thus dry the substrate 38.

In one experiment, a substrate having portions of exposed silicon oxide ($SiO_2$) was cleaned, or etched, in order to test the amount of chemical activity present on a surface of a substrate when allowing a puddle of hydrofluoric (HF) solution to stand on the surface for an extended period of time. In a first test, 200 ml of the HF solution was dispensed onto the substrate over a period of 30 seconds while the substrate was rotated at 15 rpm. An etch rate of 126.76 angstroms (Å) per minute (Å/min) resulted. In a second test, 200 ml of the HF solution was dispensed over 30 seconds while the substrate was rotated at 2250 rpm, resulting in an etch rate of 151 Å/min. In a third test, 14 ml of the solution was dispensed over 2 seconds, at 15 rpm, and allowed to stand on the substrate for 28 seconds. An etch rate of 133.72 Å/min resulted. In a fourth test, 20 ml of the solution was dispensed over 3 seconds, at 15 rpm, and allowed to stand for 27 seconds, resulting in an etch rate of 137.14 Å/min. In a fifth test, 27 ml of the solution was dispensed over 4 seconds, at 15 rpm, and allowed to stand for 26 seconds, resulting in an etch rate of 206.40 Å/min. In a sixth test, 27 ml of the solution was dispensed over 4 seconds, at 15 rpm, and allowed to stand for 56 seconds, resulting in an etch rate of 173.10 Å/min.

Thus, as indicated by the above experiment, the chemical activity (etch rate) may be increased using smaller amounts of solution and allowing the solution to stand on the substrate.

One advantage is that the efficiency of the cleaning of the particular surfaces which require expensive cleaning solutions is improved as the amount of cleaning solution required is minimized, thereby reducing manufacturing costs of the integrated circuits. Another advantage is that the spin clean apparatus does not require a system to recycle the cleaning solutions. Thus, the costs involved in manufacturing the spin clean apparatus is reduced, further reducing the manufacturing costs of the integrated circuits. A further advantage is that both sides of the semiconductor substrates may be cleaned in one pass, using different chemicals if so desired. Thus, the amount of time required to process each substrate is reduced. A further advantage is that because the cleaning solution does not need to be recycled, the risk of contamination is reduced. A further advantage is that the processing liquids used on the upper surface and the lower surface are kept completely separate, allowing the liquid on the lower surface to be recycled without being contaminated by the liquid on the upper surface. A further advantage is that because the liquid in the upper surface need not be recycled, fresh solution can be used for each substrate, providing more consistent chemistry as each substrate is exposed to the exact same chemistry.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method for cleaning a substrate comprising:
   supporting a substrate with a substrate support, the substrate having an upper surface and a lower surface;

dispensing a first amount of a first substrate processing liquid onto the upper surface of the substrate;

dispensing a second amount of a second substrate processing liquid into a gap between the lower surface of the substrate and the substrate support; and rotating the substrate at a first rate such that the first substrate processing liquid covers substantially all of the upper surface of the substrate and substantially none of the first substrate processing liquid flows off the upper surface of the substrate, and the second substrate processing liquid flows off edges of the substrate support.

2. The method of claim 1, wherein the amount of the first substrate processing liquid is less than 100 milliliters.

3. The method of claim 2, wherein the amount of the first substrate processing liquid is less than 30 milliliters.

4. The method of claim 3, wherein the first substrate processing liquid forms a standing puddle on the surface of the substrate.

5. The method of claim 4, wherein the standing puddle has a depth between approximately 100 and 200 microns.

6. The method of claim 1 wherein the first rate is less than 100 rpm.

7. The method of claim 1 wherein the first rate is less than 50 rpm.

8. The method of claim 1 wherein the first rate is less than 30 rpm.

9. The method of claim 1 further comprising removing the first substrate processing liquid from the upper surface of the substrate after a selected amount of time.

10. The method of claim 9, wherein the selected amount of time is greater than 10 seconds.

11. The method of claim 9, wherein the selected amount of time is greater than 30 seconds.

12. The method of claim 9, wherein said removal of the first substrate processing liquid from the upper surface comprises:

dispensing a third amount of third substrate processing liquid onto the upper surface of the substrate; and rotating the substrate at a second rate.

13. The method of claim 12, wherein the third amount is higher than the first amount, and the second rate is higher than the first rate.

14. The method of claim 13, wherein the third amount is more than 200 milliliters, and the second rate is more than 200 rpm.

15. The method of claim 12, wherein the first substrate processing liquid is a substrate cleaning solution, and the third substrate processing liquid is deionized water.

16. The method of claim 1, wherein the substrate is a wafer having a diameter less than or equal to approximately 300 mm.

17. The method of claim 1, further comprising applying mega sonic energy to the substrate.

18. A method for cleaning a substrate comprising:

supporting a substrate, the substrate having an upper surface and a lower surface;

dispensing a first amount of a first substrate processing liquid onto the upper surface of the substrate;

dispensing a second amount of a second substrate processing liquid into a gap below the lower surface of the substrate;

rotating the substrate at a first rate such that substantially all of the amount of the first substrate processing liquid remains on the upper surface of the substrate during said rotation; and recycling the second substrate processing liquid without it being contaminated by the first substrate processing liquid.

19. The method of claim 18, wherein the first rate is below 100 rpm.

20. The method of claim 18, wherein the first rate is below 50 rpm.

21. The method of claim 18, wherein the first rate is below 30 rpm.

22. The method of claim 18, wherein the first amount of the first substrate processing liquid is less than 100 milliliters.

23. The method of claim 18, wherein the first amount of the first substrate processing liquid is less than 30 milliliters.

24. The method of claim 18, further comprising:

dispensing a third amount of a third substrate processing liquid onto the upper surface of the substrate; and rotating the substrate at a second rate, the second rate being higher than the first rate.

25. The method of claim 18, wherein the substrate is a wafer having a diameter less than or equal to approximately 300 mm.

26. The method of claim 24, wherein the first rate is below 30 rpm and the second rate is above 200 rpm.

27. The method of claim 24, wherein the first amount is less than 30 milliliters and the third amount is more than 200 milliliters.

28. The method of claim 18, wherein the first amount of substrate processing liquid forms a standing puddle on the upper surface of the substrate, the standing puddle having a depth of between approximately 100 and 200 microns.

29. The method of claim 24, wherein the substrate has a diameter of approximately 300 mm, the first amount is approximately 15 ml, the first rate is approximately 15 rpm, and further comprising allowing the first substrate processing liquid to stand on the surface of the substrate for at least 20 seconds before rotating the substrate at the second rate.

30. The method of claim 18 further comprising further applying mega sonic energy to a lower surface of the substrate.

* * * * *